United States Patent
Cai et al.

(10) Patent No.: US 10,355,076 B2
(45) Date of Patent: Jul. 16, 2019

(54) LOW SUBSTRATE LEAKAGE ZENER DIODE WITH MODULATED BURIED JUNCTION

(71) Applicant: TEXAS INSTRUMENTS INCORPORATED, Dallas, TX (US)

(72) Inventors: Jun Cai, Allen, TX (US); Binghua Hu, Plano, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 15/799,783

(22) Filed: Oct. 31, 2017

(65) Prior Publication Data

US 2019/0131389 A1    May 2, 2019

(51) Int. Cl.
| | | |
|---|---|---|
| H01L 29/06 | (2006.01) |
| H01L 29/866 | (2006.01) |
| H01L 29/66 | (2006.01) |
| H01L 29/868 | (2006.01) |
| H01L 21/761 | (2006.01) |

(52) U.S. Cl.
CPC ........ *H01L 29/0615* (2013.01); *H01L 21/761* (2013.01); *H01L 29/66106* (2013.01); *H01L 29/866* (2013.01); *H01L 29/868* (2013.01)

(58) Field of Classification Search
CPC . H01L 29/0615; H01L 21/761; H01L 29/868; H01L 29/866; H01L 29/66106
See application file for complete search history.

(56) References Cited

U.S. PATENT DOCUMENTS

| | | | |
|---|---|---|---|
| 6,242,763 B1* | 6/2001 | Chen | H01L 27/0262 257/107 |
| 6,603,177 B2* | 8/2003 | Tang | H01L 27/0255 257/355 |
| 6,706,606 B2 | 3/2004 | Romas, Jr. et al. | |
| 8,198,703 B2* | 6/2012 | Lin | H01L 29/0646 257/106 |
| 9,257,421 B2* | 2/2016 | Huang | H01L 27/0255 |
| 9,735,291 B1* | 8/2017 | Chiou | H01L 29/866 |
| 2008/0197446 A1* | 8/2008 | Disney | H01L 21/761 257/506 |
| 2008/0230812 A1* | 9/2008 | Disney | H01L 21/76243 257/272 |
| 2009/0278168 A1* | 11/2009 | Hwang | H01L 27/0262 257/173 |
| 2013/0187238 A1* | 7/2013 | Shirai | H01L 27/0629 257/369 |

(Continued)

*Primary Examiner* — Victor A Mandala
(74) *Attorney, Agent, or Firm* — Rose Alyssa Keagy; Charles A. Brill; Frank D. Cimino

(57) ABSTRACT

In some embodiments, an apparatus comprises a semiconductor layer doped with a first-type dopant, a first region doped with the first-type dopant, a second region doped with the first-type dopant, and a third region doped with a second-type dopant, where the second-type dopant is opposite the first-type dopant. The first, second, and third regions are non-overlapping and are formed in the semiconductor layer. The third region is positioned between the first region and the second region. The apparatus also comprises a plurality of Zener implant regions buried in the semiconductor layer and the third region, where each of the plurality of Zener implant regions is configured to generate a different pinch-off region.

20 Claims, 9 Drawing Sheets

(56) References Cited

U.S. PATENT DOCUMENTS

| | | | |
|---|---|---|---|
| 2014/0126091 A1* | 5/2014 | Gill | H02H 9/044 |
| | | | 361/56 |
| 2015/0069424 A1* | 3/2015 | Willemen | H01L 27/0255 |
| | | | 257/84 |
| 2017/0236816 A1* | 8/2017 | Tsai | H01L 27/0255 |
| | | | 257/112 |
| 2018/0175018 A1* | 6/2018 | Suresh | H01L 29/66106 |

* cited by examiner

LOW SUBSTRATE LEAKAGE ZENER DIODE WITH MODULATED BURIED JUNCTION

BACKGROUND

Integrated smart power circuits have gained importance as many segments of microelectronics move towards system integration. Smart power technologies offer the monolithic system integration of many complex circuits—analog, digital and power—on a single chip, enabling the design and production of even more miniaturized systems for different applications in the fields of automotive (e.g., anti-lock braking, airbag systems, anti-theft devices, engine management of the car, etc.), industrial electronics (e.g., intelligent switches, driving circuits for stepper motors, etc.), telecommunications, and electronic data processing. Voltage generation and stabilization within the system is one of the main requirements for the realization of an efficient smart power circuit. In such circuits, the sub-surface Zener diode, which may be referred to as a "buried Zener diode," can be used for voltage regulation, voltage clamping, and protection against electrostatic discharge events.

SUMMARY

In some embodiments, an apparatus comprises a semiconductor layer doped using with a first-type dopant, a first region doped with the first-type dopant, a second region doped with the first-type dopant, and a third region doped with a second-type dopant, where the second-type dopant is opposite the first-type dopant. The first, second, and third regions are non-overlapping and are formed in the semiconductor layer, where the third region is positioned between the first region and the second region. The apparatus also comprises a plurality of Zener implant regions buried in the semiconductor layer and the third region, where each of the plurality of Zener implant regions is configured to generate a different pinch-off region.

In some embodiments, an apparatus comprising a buried Zener diode includes a semiconductor layer doped with a first-type dopant, a first region doped with the first-type dopant and a second region doped with the first-type dopant. The first region is to form at a first position on the semiconductor layer and the second region is to form at a second position on the semiconductor layer. The apparatus further comprises multiple, non-overlapping, highly-doped regions buried in the semiconductor layer and in a lightly-doped region.

In some embodiments, a method of fabricating a buried Zener diode comprises growing an epitaxial layer and a semiconductor layer using a first-type dopant; growing a plurality of shallow-trench isolation regions and multiple sinker paths diffused along sidewalls of at least one of the plurality of shallow-trench isolation regions; and growing a plurality of Zener implant regions in the semiconductor layer. The method also comprises growing a first region doped with a second-type dopant in the semiconductor layer such that each of the plurality of Zener implant regions is buried in the semiconductor layer and in the first region. The method further comprises growing each of a second region and a third region in the semiconductor layer such that each of the second and third regions doped with the first-type dopant. The method further comprises growing a first isolation layer between the first region and the second region and a second isolation layer between the first region and the third region.

BRIEF DESCRIPTION OF THE DRAWINGS

For a detailed description of various examples, reference will now be made to the accompanying drawings, in which.

DETAILED DESCRIPTION

Figure 1A:
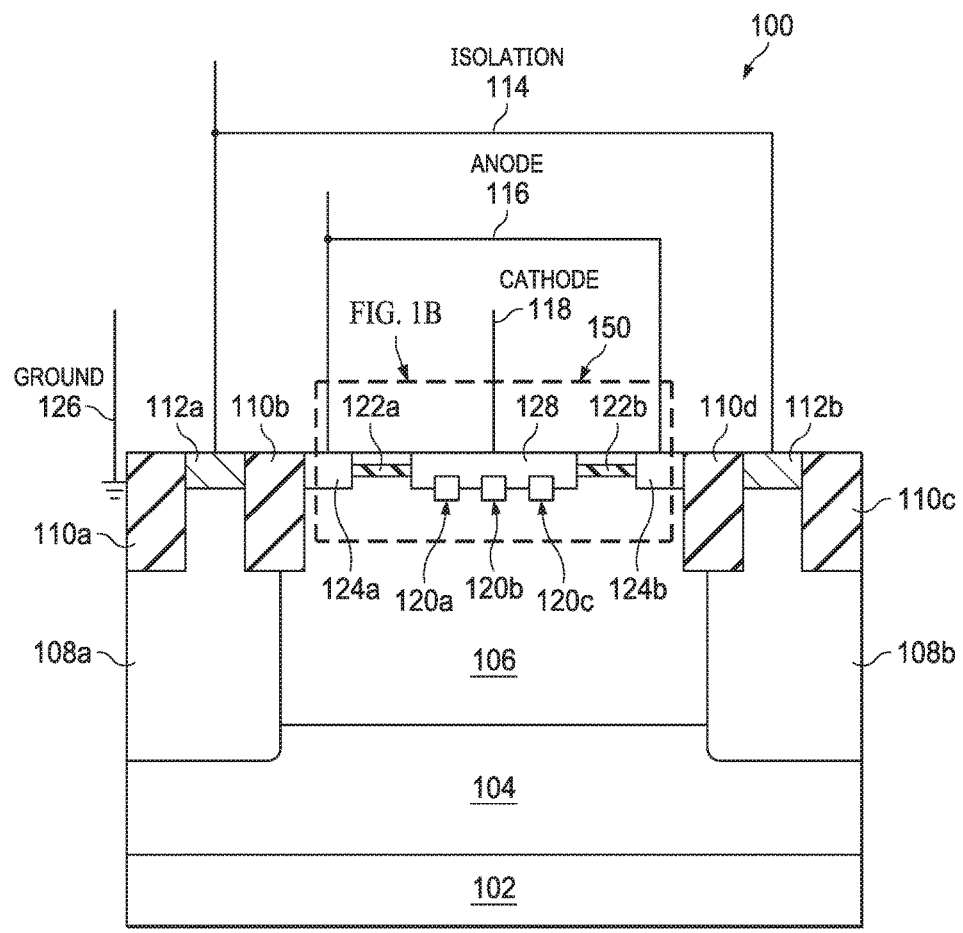
FIG. 1A is a cross-sectional side view of an illustrative buried Zener diode in accordance with various embodiments.

The protective circuitry in an integrated smart power circuit usually comprises diodes and Zener diodes. Conventional Zener diodes usually exhibit high substrate leakage currents at a reverse breakdown point of around 5.5-7 V for a typical 5V power rail application. A surface Zener diode with adjustable breakdown voltage might be a good option for protection purposes, but it is difficult to be maintained at a consistent clamp voltage within a given load current change due to surface degradation. The buried Zener diode is a reference source for accurate smart power circuits as the breakdown region is located deeper in the structure and thus is less noisy and more stable over the entire lifetime of the circuit than are surface Zener diodes. In general, buried Zener diodes, especially when used in the smart power technologies, should have a very low initial error, ultra low temperature coefficient, ultra-low noise level, and long-term stability. Several different junction structures could be employed to obtain low substrate leakage currents with optimum breakdown voltages in buried Zener diodes. The buried Zener diode is typically built inside an isolation tub with one or more extra Zener implant layers added to reduce the substrate leakage current. The manufacture of buried Zener diodes generally requires additional process steps beyond those typically used in a standard CMOS-based process flow.

A buried Zener diode can be formed with a BJT-based process flow having up-down isolation layers, which may or may not be compatible with advanced CMOS-based analog power technology. Other solutions typically use extra Zener implant layers to form buried Zener diodes, but the reverse saturation leakage current is still high even with one or more of the added layers. The substrate leakage current caused by the Zener diode tunneling current at diode reverse region is undesirable because it can disturb operation of other components and devices of the circuit with which the Zener diode is integrated and also with increased power dissipation. Thus, there is a need in the art for methods and systems to improve the breakdown voltage in the range from 5.5 V-7 V at reduced substrate leakage currents.

The present disclosure provides techniques to significantly improve the performance of the buried Zener diode structure without requiring a significant increase in additional manufacturing steps when compared to the average manufacturing process. More specifically, the present disclosure relates to increasing the breakdown voltage at reduced substrate leakage current by employing a plurality of intrinsic "buried" Zener implant regions in parallel with a plurality of intrinsic "buried" avalanche regions. Typically, the Zener breakdown occurs at a breakdown voltage, or Zener knee voltage, of around 5.5-5.6 V and that results in a high reverse leakage current for a 5 V power rail. It is desirable to have the breakdown voltage range from 5.5 V-7 V and an ideal breakdown voltage is approximately 6.2 V for a 5 V gate. The invention disclosure proposes a solution to increase the breakdown voltage to target a reduced substrate leakage current without adding extra layers to the structure.

In some embodiments, a plurality of intrinsic Zener diodes and avalanche diodes are formed in the Zener implant regions and the avalanche regions, respectively. When a Zener diode is in reverse bias, the tunneling current within the Zener diode increases with an increase in the reverse-biased voltage and thus modulates the nearby depletion regions of the respective avalanche diodes by injecting an increased number of electrons relative to the number of electrons that would otherwise be injected. At an increased electric field, the Zener diode junction becomes narrow enough to build a constricted region, called a pinch-off region, underneath the bottom of the Zener diode junction through nearby modulated avalanche depletion regions for an increased Zener breakdown. An increased breakdown voltage at a reduced reverse saturation current is achieved due to the formation of the pinch-off regions. The pinch-off region is defined as the location in a current channel portion of a Junction field effect transistor (JFET) where the current is reduced to a minimum value at a particular reverse-biased voltage due to the diameter of the channel being reduced, e.g., to a minimum.

FIG. 1A is a cross-sectional side view of an illustrative embodiment of a buried Zener diode 100. The buried Zener diode 100 may comprise a substrate 102; a buried layer 104; a semiconductor layer 106; multiple sinker paths 108a and 108b; a first region 124a; a second region 124b; a third region 128; a plurality of Zener implant regions 120a, 120b and 120c; a first isolation layer 122a, a second isolation layer 122b; multiple shallow-trench isolation regions 110a, 110b, 110c, and 110d; multiple isolation contacts 112a and 112b; an isolation 114; an anode 116; a cathode 118; and a connection to ground 126.

The substrate 102 may comprise any suitable, lightly-doped semiconductor material (e.g., elements from column IV of the periodic table of elements as well as combinations of elements from columns III-V). The semiconductor material used for the substrate 102 can be doped to be either n-type or p-type, but is typically p-type. As used here, an n-type semiconductor material is a semiconductor material that has an abundance of mobile electrons in the material, while a p-type semiconductor material is a semiconductor material that has an abundance of holes in the material. An n-type semiconductor material can be formed by introducing an appropriate impurity species from group V elements (e.g., phosphorus, arsenic, or antimony) into the semiconductor material, and a p-type semiconductor material can be formed by introducing an appropriate impurity species from group III elements (e.g., boron or aluminum) into the semiconductor materials. The group V element is said to behave as an electron donor, and the group III element as an acceptor. In this context, n-type dopant is opposite the p-type dopant. For this particular embodiment, the substrate 102 is a lightly-doped p-type semiconductor material having a dopant concentration within the range of about $1 \times 10^{15}$ to $5 \times 10^{15}$ cm$^{-3}$. The buried layer 104 is a moderately-doped n-type region overlying at least a portion of the substrate 102 with a dopant concentration of about $1 \times 10^{17}$ cm$^{-3}$ to $1 \times 10^{19}$ cm$^{-3}$. The semiconductor layer 106 occupies the space generally defined above the buried layer 104 and is a moderately-doped p-type semiconductor material. In this particular embodiment, the semiconductor layer 106 has a dopant concentration of approximately $1 \times 10^{16}$ cm$^{-3}$ to $1 \times 10^{18}$ cm$^{-3}$. The sinker paths 108a and 108b are formed overlying a portion of the buried layer 104. In this embodiment, the sinker paths 108a and 108b are formed at or near the outer periphery of the buried layer 104. For this particular implementation, the sinker paths 108a and 108b comprise moderately-doped n-type semiconductor material. In certain embodiments, the sinker paths 108a and 108b have dopant concentrations of about $1 \times 10^{17}$ cm$^{-3}$ to $5 \times 10^{19}$ cm$^{-3}$. The shallow-trench isolation regions 110a, 110b, 110c and 110d are positioned between the active semiconductor materials to laterally isolate elements of the buried Zener diode 100 as depicted in FIG. 1A. The sinker paths 108a and 108b are diffused along sidewalls of at least one of the shallow-trench isolation regions 110a, 110b, 110c, and 110d.

The first region 124a and the second region 124b are formed at a first position and a second position, respectively, near the upper surface of the semiconductor layer 106. The third region 128 is formed at a third position near the upper surface of the semiconductor layer 106. For this embodiment, the first region 124a and the second region 124b are formed from heavily-doped p-type semiconductor material, with a dopant concentration of about $5 \times 10^{19}$ cm$^{-3}$ to $1 \times 10^{21}$ cm$^{-3}$. The third region 128 is formed from heavily-doped n-type semiconductor material, with a dopant concentration of about $5 \times 10^{19}$ cm$^{-3}$ to $1 \times 10^{21}$ cm$^{-3}$. In practice, since the first region 124a, the second region 124b and the third region 128 are formed in active semiconductor regions, they may be realized as shallow and heavily-doped source/drain regions (for example, the first region 124a and the second region 124b may be referred to as a p-type source/drain region, and the third region 128 may be referred to as an n-type source/drain region). The first isolation layer 122a between the first region 124a and the third region 128 and the second isolation layer 122b between the second region 124b and the third region 128 are configured to ensure that silicide is not formed on some of the underlying active semiconductor material. The first isolation layer 122a and the second isolation layer 122b cover edges of the source/drain regions, obstructing the extension of the silicide layer. The Zener implant regions 120a, 120b, and 120c are buried in the semiconductor layer 106 and the third region 128. The detailed description of Zener implant regions 120a, 120b, and 120c are discussed below in tandem with FIG. 1B.

In some embodiments, the buried Zener diode 100 is configured as a three terminal device corresponding to the anode 116, the cathode 118 and the isolation 114. The first region 124a along with the second region 124b are electrically coupled to the anode 116 by conductive routing, metal interconnect structures, or other electrically conductive elements. Consequently, the voltage potential maintained at the anode 116 of the buried Zener diode 100 will also be present at the first region 124a and the second region 124b. The third region 128 is electrically coupled to the cathode 118 and the voltage potential maintained at the cathode 118 of the buried Zener diode 100 will also be present at the third region 128. The anode 116 and the cathode 118 serve as the typical voltage terminals across the buried Zener diode 100 and can be formed using known semiconductor process techniques, including photolithography, source/drain ion implantation, silicidation, and thermal activation. The isolation 114 is used to bias the sinker paths 108a and 108b and the buried layer 104, where the isolation 114 serves as an isolation ring for the buried Zener diode 100. Moreover, the sinker paths 108a and 108b have associated isolation contacts 112a and 112b, respectively, that are located at and near the upper surface of the buried Zener diode 100. Either the sinker paths 108a and 108b or the shallow-trench isolation regions 110a, 110b, 110c, and 110d etched through the semiconductor layer 106 are configured to provide the ground 126 to the substrate 102. In certain implementations, the isolation contacts 112a and 112b are realized as heavily doped n-type regions formed at the upper surfaces of the sinker paths 108a and 108b. For example, the isolation contacts 112a and 112b have a typical dopant concentration of about $5 \times 10^{19}$ cm$^{-3}$ to $1 \times 10^{21}$ cm$^{-3}$.

Figure 1B:
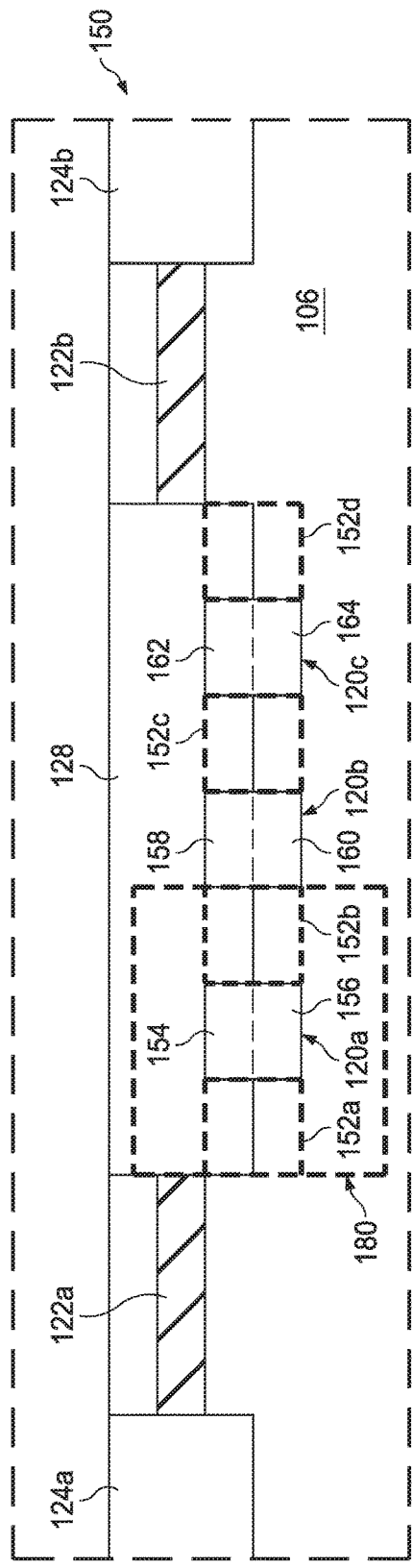
FIG. 1B is an enlarged cross-sectional side view of a section of the buried Zener diode including a plurality of Zener implant regions and avalanche regions in accordance with various embodiments.

FIG. 1B is an enlarged, cross-sectional side view of a section 150 of the buried Zener diode 100, such as that depicted in FIG. 1A. The section 150 includes the semiconductor layer 106; the first region 124a; the second region 124b; the third region 128; the first isolation layer 122a; the second isolation layer 122b; the plurality of highly doped Zener implant regions 120a, 120b, and 120c; and a plurality of lightly doped avalanche regions 152a, 152b, 152c, and 152d. The Zener implant regions 120a, 120b, and 120c have dopant concentration of about $5 \times 10^{17}$ to $5 \times 10^{19}$ cm$^{-3}$. However, the avalanche regions 152a, 152b, 152c, and 152d have dopant concentration of about $1 \times 10^{16}$ to $1 \times 10^{18}$ cm$^{-3}$. In some embodiments, each of the Zener implant regions 120a, 120b, and 120c has a width of around 0.1 µm to 0.5 µm and comprises diffusion of first doped wells 154,158, and 162, and second doped wells 156,160, and 164, respectively. In some embodiments, each of the avalanche regions 152a, 152b, 152c, and 152d comprises diffusion of the third region 128 and the semiconductor layer 106. Each of the plurality of Zener implant regions 120a, 120b, and 120c is positioned between a pair of the plurality of avalanche regions 152a, 152b, 152c, and 152d respectively.

The first doped wells 154,158, and 162 are implanted in a portion of the third region 128 and the second doped wells 156, 160, and 164 are implanted in a portion of the semiconductor layer 106. Thus, the plurality of Zener implant regions 120a, 120b, and 120c are electrically connected to, and physically contact, the third region 128. The first doped wells 154, 158, and 162 are realized as highly-doped n-type semiconductor materials and the second doped wells 156, 160, and 164 are realized as highly-doped p-type semiconductor materials. The first doped wells 154, 158, and 162 and the second doped wells 156, 160, and 164 have typical dopant concentrations of between $1 \times 10^{18}$ cm$^{-3}$ to about $5 \times 10^{19}$ cm$^{-3}$. In this particular embodiment, the first doped wells 154,158, and 162 are doped using arsenic (As) as the n-type, whereas the second doped wells 156, 160, and 164 are doped using boron11 (B11) as the p-type with dopant concentrations of approximately $5 \times 10^{17}$ and $5 \times 10^{19}$ cm$^{-3}$. In some embodiments, the Zener implant regions 120a, 120b, and 120c are fabricated in parallel with the avalanche regions 152a, 152b, 152c, and 152d. A single unit 180 of the section 150 may comprise the Zener implant region 120a inserted between two avalanche regions 152a and 152b. The operation of the section 150 of the buried Zener diode 100 is described below in tandem with FIG. 2A.

Figure 1C:
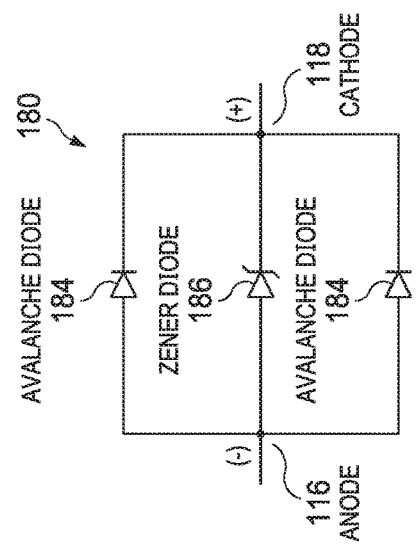
FIG. 1C is a circuit schematic representation of a single unit of the section shown in FIG. 1B, including one Zener implant region inserted between two avalanche regions in accordance with various embodiments.

FIG. 1C is a circuit schematic representation of a single unit 180 of the section 150 shown in FIG. 1B. The single unit 180 comprises one Zener diode 186; two avalanche diodes 182 and 184; and anode 116 and cathode 118. The Zener implant region 120a of FIG. 1B may be represented as the Zener diode 186. Similarly, the avalanche regions 152a and 152b of FIG. 1B may be represented as the avalanche diodes 182 and 184, respectively. The avalanche diodes 182 and 184 share the same anode 116 and cathode 118 with the Zener diode 186. The single unit 180 is reverse-biased by applying a positive voltage at cathode 118 and a negative voltage at anode 116.

The n-side of the Zener diode 186 is formed by the third region 128 and the first doped well 154 shown in the section 150 of FIG. 1B. Similarly, the p-side of the Zener diode 186 is formed by the semiconductor layer 106 and the second doped well 156 shown in the section 150 of FIG. 1B. The third region 128 forms the n-side and the semiconductor layer 106 forms the p-side of each of the avalanche diodes 182 and 184, respectively. This is applicable to each of the plurality of Zener implant regions 120a,120b, and 120c and each of the plurality of avalanche regions 152a,152b,152c, and 152d shown in FIG. 1B. The operation of the single unit 180 of the section 150 of the buried Zener diode 100 is described below in tandem with FIG. 2A.

Figure 2A:
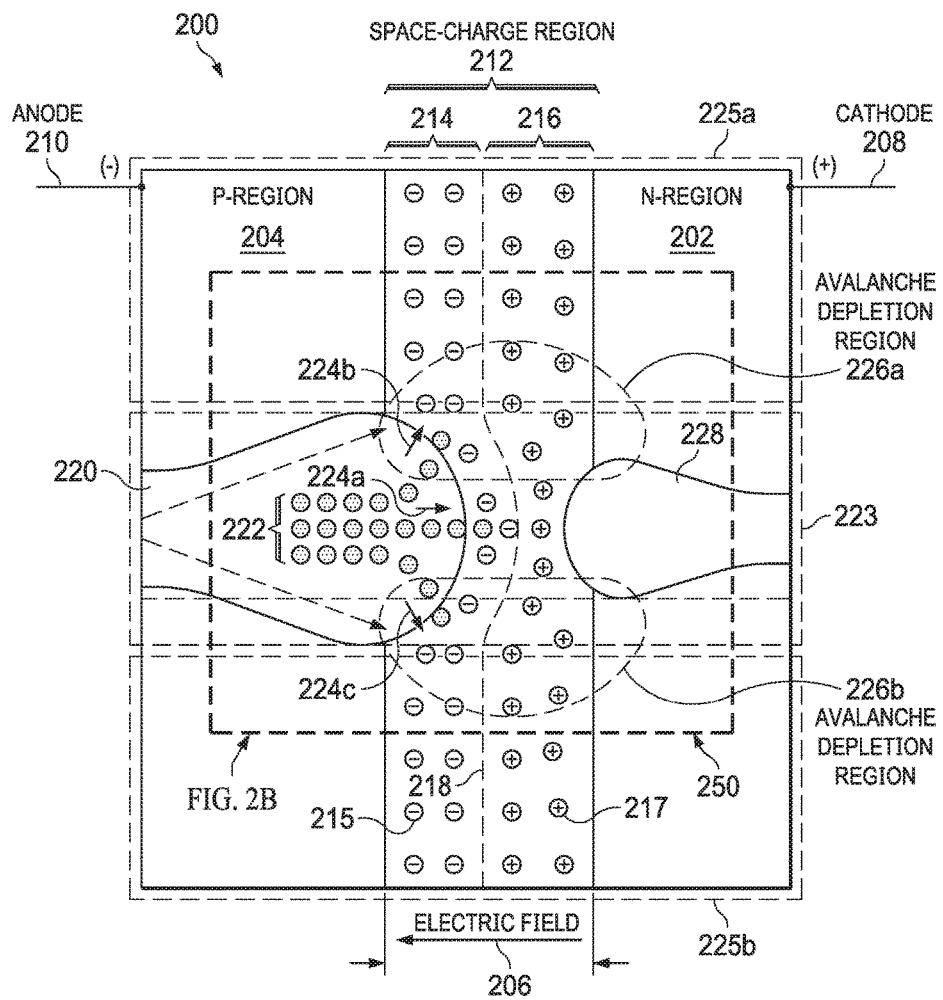
FIG. 2A is a conceptual view of an illustrative p-n junction of the circuit of FIG. 1C in accordance with various embodiments.

FIG. 2A is a conceptual view of an illustrative p-n junction 200 of the circuit representation of the single unit 180 depicted in FIG. 1C. The p-n junction 200 may comprise an n-region 202; a p-region 204; an electric field 206; a cathode 208; an anode 210; a space-charge region 212; an ionized acceptor impurities region 214; an electron 215; an ionized donor impurities region 216; a hole 217; tunneling electrons 222; a Zener diode 223; a Zener diode depletion region 224a; a plurality of modulation regions 224b and 224c; a plurality of avalanche diodes 225a and 225b; a junction 218; a p-side of Zener diode 220; an n-side of Zener diode 228; and a plurality of avalanche diode depletion regions 226a and 226b. FIG. 2A depicts the formation of the plurality of modulation regions 224b and 224c. In some embodiments, the region between the Zener diode 223 and the avalanche diodes 225a form the modulation region 224b. Similarly, the region between the Zener diode 223 and the avalanche diodes and 225b form the modulation region 224c.

In operation, when the n-region 202 and p-region 204 are placed together to form the p-n junction 200, the space charge region 212 forms instantaneously across the p-n junction 200 in thermal equilibrium. The space-charge region 212 comprises the ionized acceptor impurities region 214 and the ionized donor impurities region 216 separated by the junction 218. The uncompensated ions are holes 217 on the n-region 202 side and electrons 215 on the p-region 204. The presence of impurity ions on both sides of the junction 218 causes the electric field 206 to be established across this region with the n-region 202 at a positive voltage relative to the p-region 204. The direction of electric field 206 is shown by an arrow adjacent to the numeral 206 in FIG. 2A. When reverse-biased, the positive voltage potential at the cathode 208 is higher than the negative voltage potential at the anode 210. As the reverse-bias applied to the p-n junction 200 is increased to a certain level, electron quantum tunneling begins due to the high strength electric field 206 in the highly doped Zener diode 223 with the narrow Zener diode depletion region 224a. When the reverse-bias voltage is further increased, the adjacent lightly-doped avalanche diode depletion regions 226a and 226b are modulated by injecting more tunneling electrons 222 into the modulation regions 224b and 224c. Thus, the avalanche diode depletion regions 126a and 126b become narrower at the increased electrical field 206 for a reduced avalanche breakdown voltage.

Figure 2B:
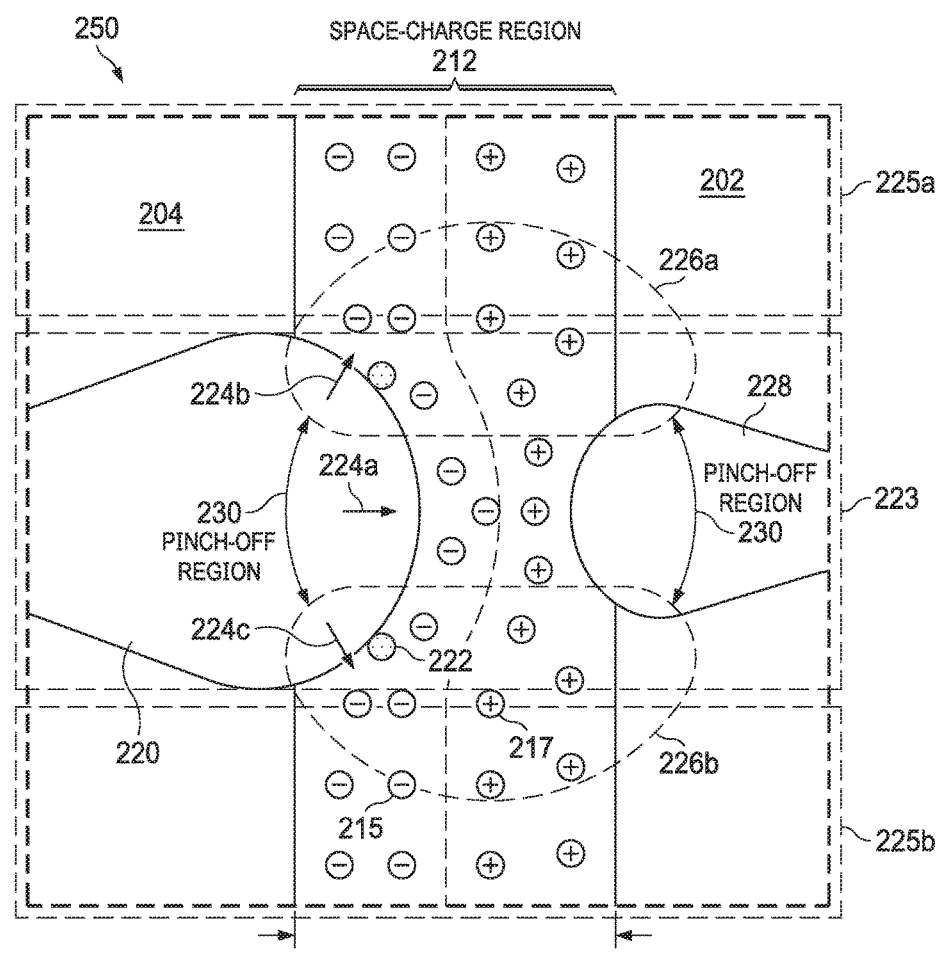
FIG. 2B is an enlarged conceptual view of the p-n junction of FIG. 2A in accordance with various embodiments.

FIG. 2B is an enlarged conceptual view of the section 250 of p-n junction 200 depicted in FIG. 2A. The section 250 as depicted in FIG. 2B shows the formation of a pinch-off region 230 between the modulation regions 224b and 224c.

In operation, the continuous injection of the tunneling electrons 222 widens the modulation regions 224b and 224c and also with an increased electric field across the modulated avalanche diode depletion regions 226a and 226b. At one stage, the increased electric field 206 in the modulation regions 224b and 224c extend close enough to reduce the effective width of the Zener diode 223 for tunneling current and thus form the pinch-off region 230. In some embodiments, the pinch-off region 230 is a local JFET pinch-off built underneath the bottom of the Zener diode 223 through adjacent avalanche diodes 225a and 225b. On further increasing the reverse-biased voltage, an effective resistance of the Zener diode 223 increases due to stronger electric field 206 in the modulation regions 224b and 224c resulting in the JFET pinch-off phenomenon. The JFET pinch-off eventually restricts the flow of the substrate leakage current for an increased breakdown voltage in the Zener diode 223. The above-mentioned principle is applicable to the plurality of Zener implant regions shown in FIG. 1B, resulting in the formation of different pinch-off regions.

Figure 3A:
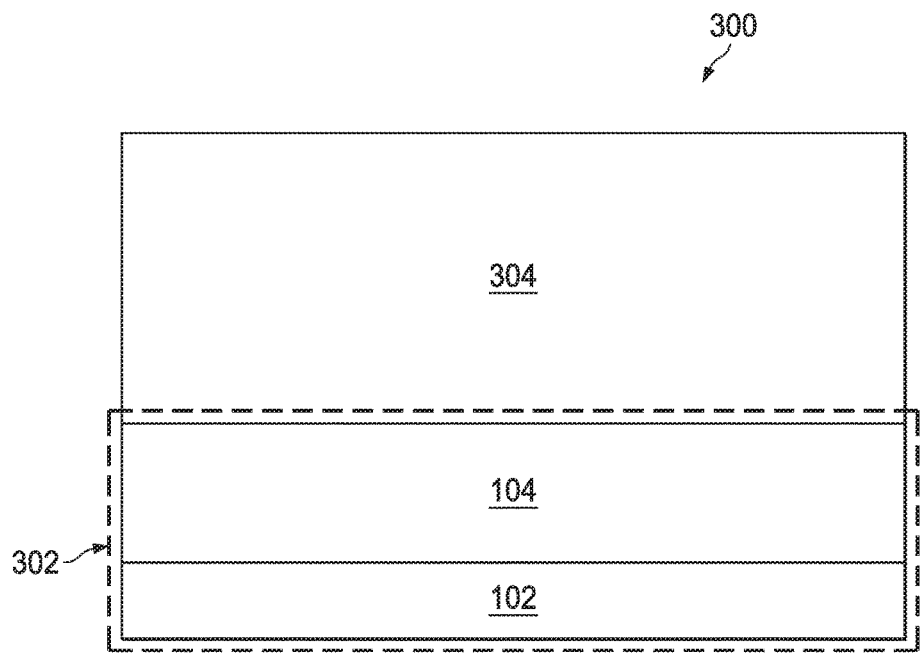
FIGS. 3A, 3B, 3C, 3D, 3E, 3F, and 3G are cross-sectional side views showing a process of fabricating the buried Zener diode of FIG. 1A in accordance with various embodiments.

Referring to FIG. 3A, a cross-sectional side view of an illustrative structure 300 for the fabrication in accordance with various embodiments is shown. The structure 300 may comprise an isolation tub 302 and an epitaxial layer 304. The isolation tub 302 may further comprise the substrate 102 and the buried layer 104.

The fabrication of the isolation tub 302 begins with the substrate 102, which may be a lightly- or moderately-doped p-type silicon wafer or other semiconductor substrate. It may next include the formation of the buried layer 104 by implanting ions of a suitable impurity species into the substrate 102 to form an n-type region corresponding to the buried layer 104. The buried layer 104 can be deposited in the substrate 102 by various processes, such as gaseous diffusion or ion beam implantation with the remainder of the substrate 102 masked. In some embodiments, at a later stage of fabrication the epitaxial layer 304 is doped with a light p-type doping and is grown from the buried layer 104. The thickness of the epitaxial layer 304 will depend upon the nature of application intended. The epitaxial layer 304 is configured to be used as the foundation for the other layers and implant regions of the buried Zener diode 100 of FIG. 1A. The process comprises masking, implanting, and thermal diffusion according to known techniques. These and possibly other variations could be employed to fabricate the buried Zener diode 100 having the general structures, features and regions depicted in FIG. 3B-FIG. 3G.

Figure 3B:
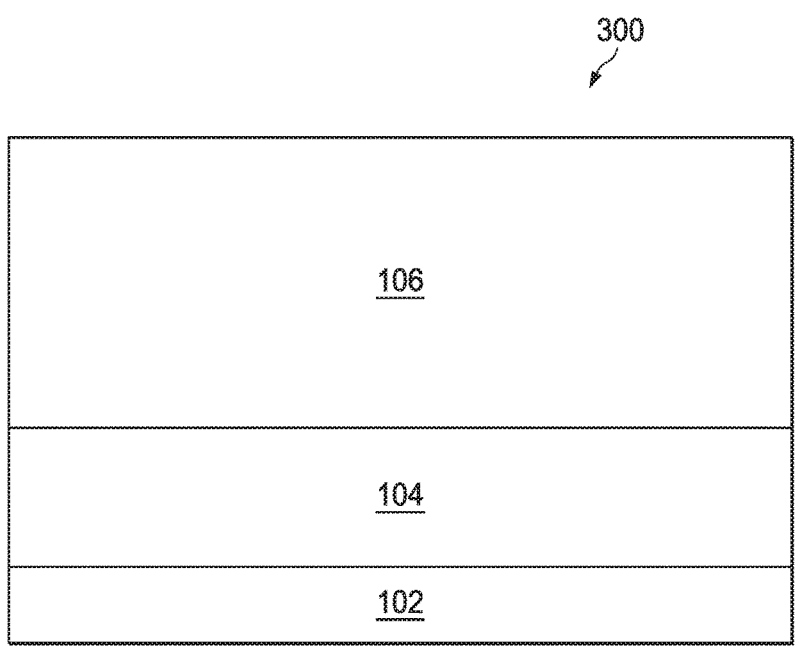

FIG. 3B is a cross-sectional side view of the structure 300 of FIG. 3A at a later stage of fabrication and depicts the formation of the semiconductor layer 106. The semiconductor layer 106 is formed using a suitable ion implantation mask such that it occupies the space generally defined above the buried layer 104. The semiconductor layer 106 includes moderately doped p-type semiconductor material. In other embodiments, the semiconductor layer 106 could be formed by different implant steps or doping procedures with different masks.

Figure 3C:
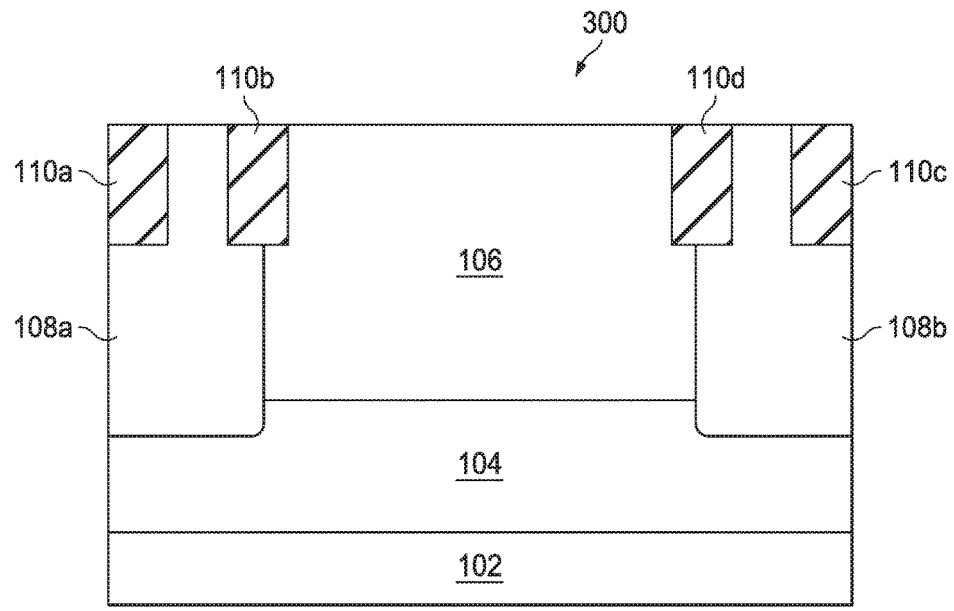

FIG. 3C is a cross-sectional side view of the structure 300 of FIG. 3B at a later stage of fabrication and depicts the formation of the plurality of shallow-trench isolation regions 110a, 110b, 110c, and 110d and multiple sinker paths 108a and 108b. The sinker paths 108a and 108b are formed overlying a portion of the buried layer 104 at or near the outer periphery. In practice, the sinker paths 108a and 108b and the buried layer 104 may be formed in the same semiconductor material, which has been subjected to appropriate ion-implantation processes. The shallow-trench isolation regions 110a, 110b, 110c, and 110d are formed between the active semiconductor materials using a shallow-trench isolation (STI) process, a local oxidation of silicon (LOCOS) process or other methods as known to those skilled in the art. In some embodiments, the widths of the shallow-trench isolation regions 110a, 110b, 110c, and 110d are determined by standard process nodes.

Figure 3D:
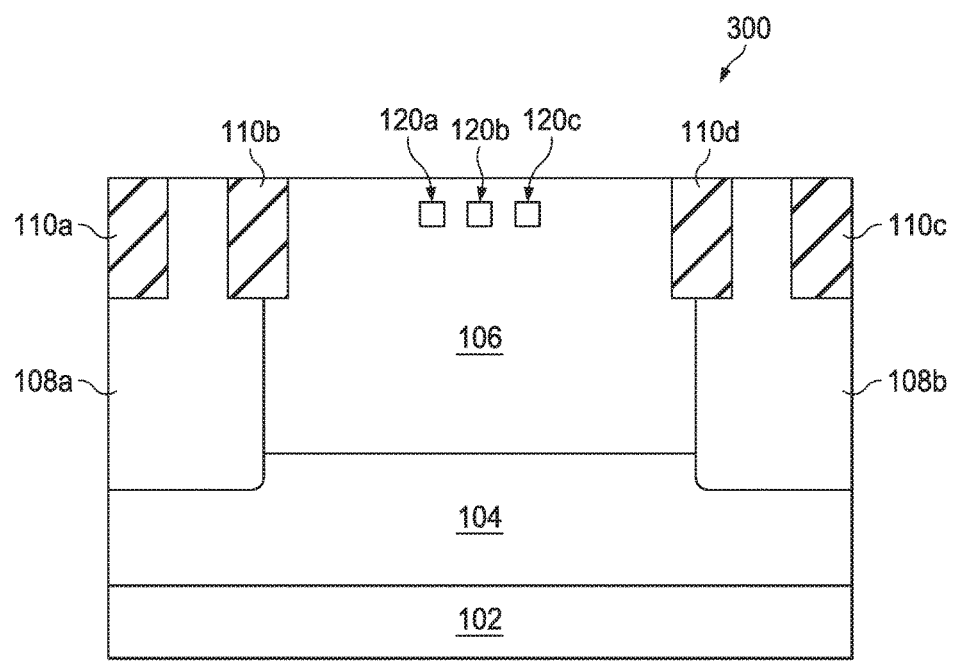

FIG. 3D is a cross-sectional view of the structure 300 of FIG. 3C at a later stage of fabrication and depicts the formation of a plurality of Zener implant regions. The Zener implant regions 120a, 120b, and 120c are formed in the semiconductor layer 106 as depicted in FIG. 3D by using the process steps that may include additional implants/depositions, well diffusions, or oxide etches. In this particular embodiment, boron11 and arsenic are implanted with dopant concentrations of approximately $5\times10^{17}$ and $5\times10^{19}$ cm$^{-3}$ and $1\times10^{18}$ cm$^{-3}$ to about $5\times10^{19}$ cm$^{-3}$, respectively, to form the p-/n-side of the Zener implant regions 120a, 120b, and 120c.

Figure 3E:
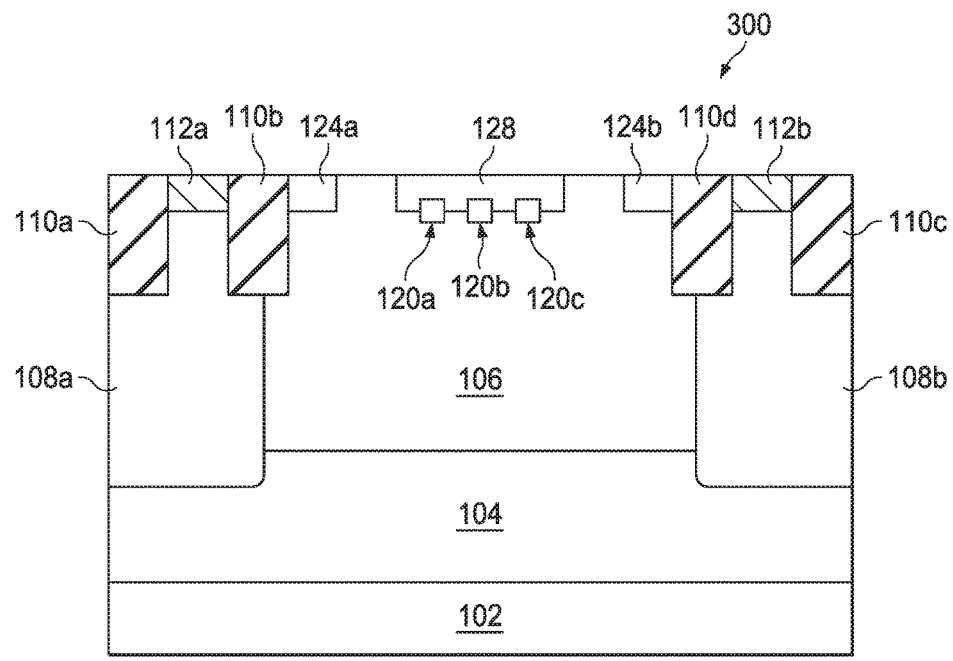

FIG. 3E is a cross-sectional view of the structure 300 of FIG. 3D at a later stage of fabrication and depicts the formation of the first, second, and third regions. The first region 124a, the second region 124b and the third region 128 are configured as non-overlapping regions and are formed near the upper surface of the semiconductor layer 106 using associated lithographic masks, implants and thermal activation according to known techniques. In other embodiments, various regions and layers may be formed by other doping methods other than implantation. The doping profile within a given region may vary with its depth, width, and/or other dimensions. The third region 128 and the isolation contacts 112a and 112b are implanted at or near the upper surface of the structure 300, with a dopant concentration of about $5\times10^{19}$ cm$^{-3}$ to $1\times10^{21}$ cm$^{-3}$. The third region 128 comprises the n-side of the each of the avalanche regions 152a, 152b, 152c, and 152d and the first doped wells 154,158, and 162 of the each of the Zener implant regions 120a, 120b, and 120c, respectively. The first region 124a and the second region 124b are implanted at or near the upper surface of the structure 300, with a dopant concentration of about $5\times10^{19}$ cm$^{-3}$ to $1\times10^{21}$ cm$^{-3}$.

Figure 3F:
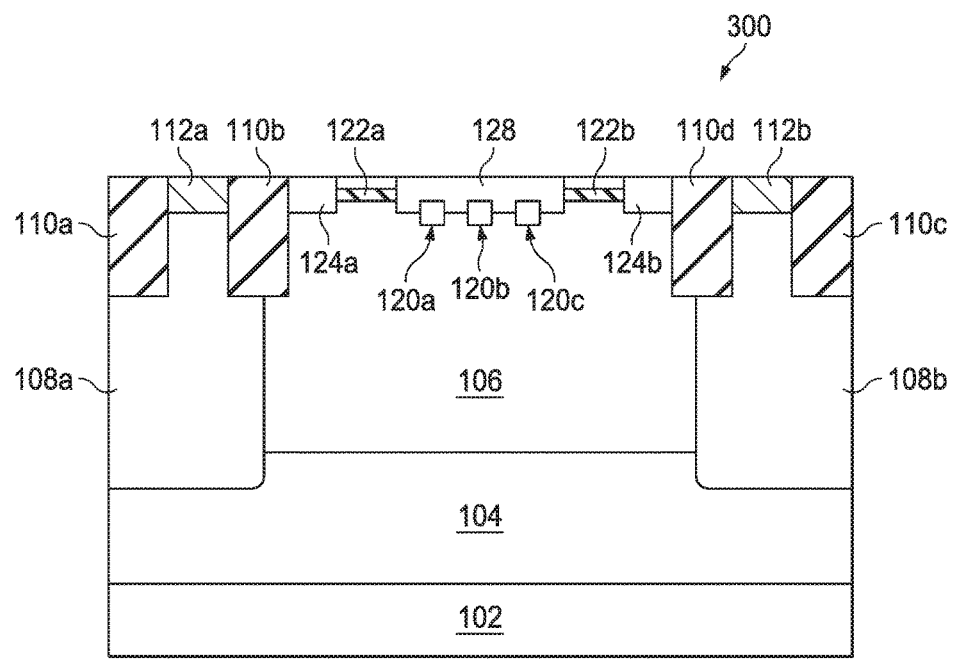

FIG. 3F is a cross-sectional view of the structure 300 of FIG. 3E at a later stage of fabrication and depicts the formation of the first and second isolation layers. The first isolation layer 122a and the second isolation layer 122b are configured to form non-electrical contacts between the first region 124a and the third region 128, and between the second region 124b and the third region 128, respectively. The first isolation layer 122a and the second isolation layer 122b are formed by oxide deposition and mask lithography, followed by silicidation processing according to known techniques.

Figure 3G:
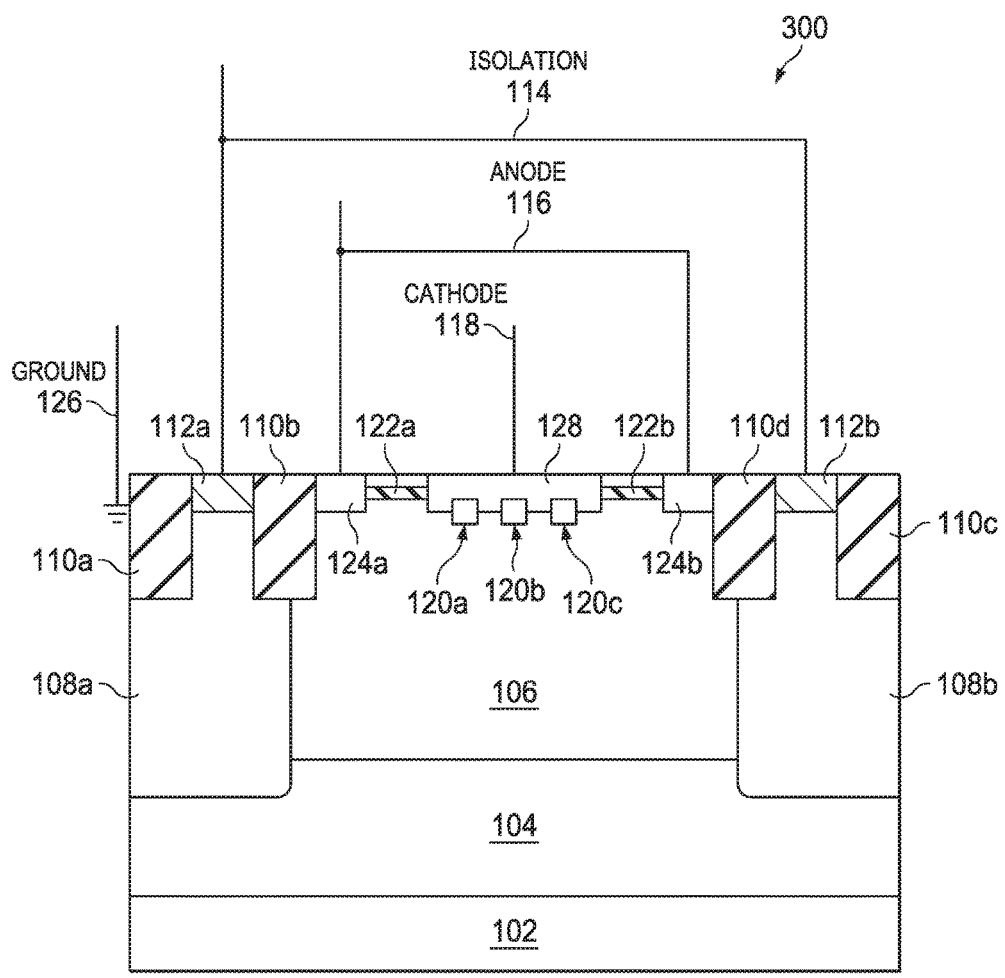

FIG. 3G is a cross-sectional view of the structure 300 of FIG. 3F at a later stage of fabrication and depicts the back-end processes. The back-end processes may involve standard VLSI fabrication processing steps performed to provide metallization and passivation.

Figure 4:
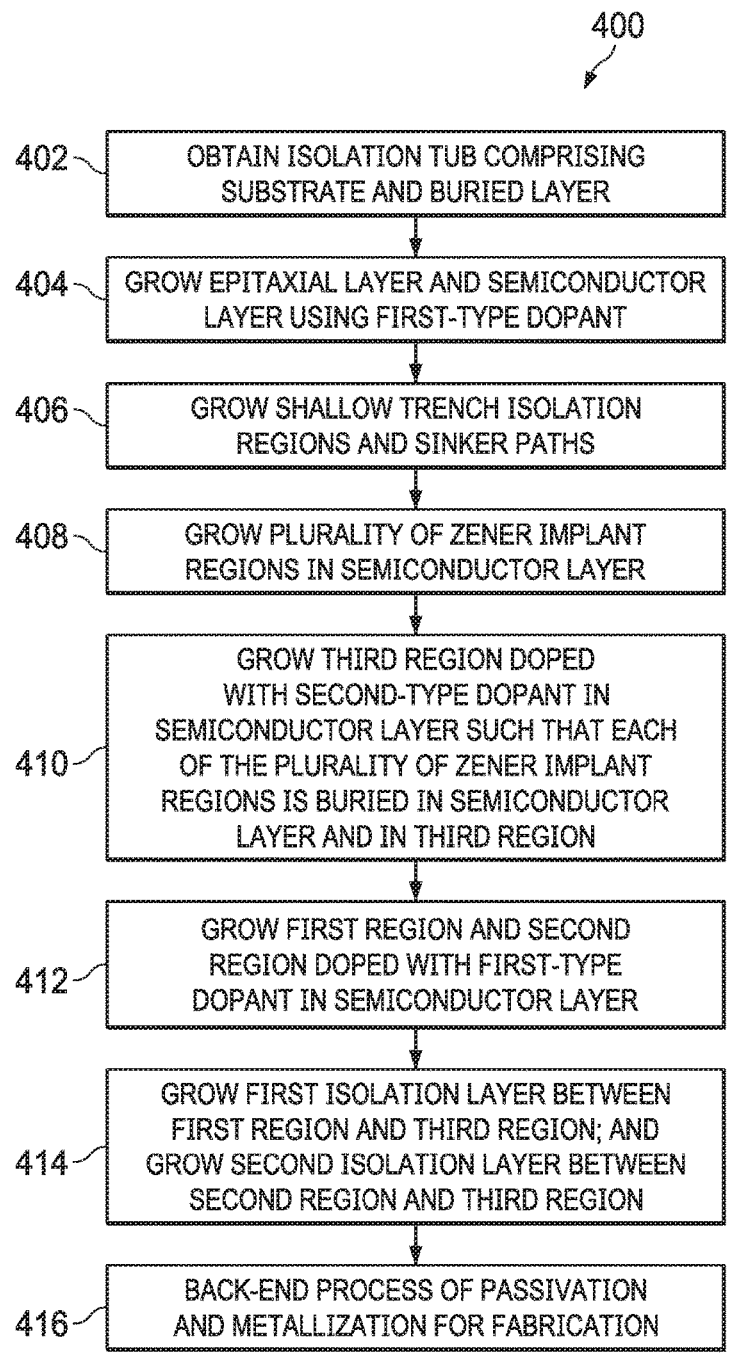
FIG. 4 is an illustrative flow diagram of a method for fabricating the buried Zener diode of FIG. 1A in accordance with various embodiments.

FIG. 4 is a flow diagram of an illustrative method 400 for fabricating the buried Zener diode 100 of FIG. 1A in accordance with various examples. The method 400 is described in tandem with FIG. 3A-FIG. 3G. The method 400 may begin with obtaining an isolation tub (step 402), such as the isolation tub 302 depicted in the structure 300 of FIG. 3A comprising the substrate 102 and the buried layer 104. The method 400 may next include growing the epitaxial layer 304 using a light p-type doping over the buried layer 104 as depicted in FIG. 3A and at the same time doping the epitaxial layer 304 with the semiconductor layer 106 using a light p-type doping (step 404) as depicted in FIG. 3B. The method 400 may continue by growing the plurality of shallow-trench isolation regions 110a, 110b, 110c, and 110d and multiple sinker paths 108a and 108b (step 406) as depicted in FIG. 3C. The method 400 may then comprise growing a plurality of Zener implant regions in a semiconductor layer (step 408), such as the Zener implant regions 120a, 120b, and 120c and the semiconductor layer 106 depicted in the structure 300 of FIG. 3D.

The method 400 may further comprise growing the third region 128 by implanting n-type doping in the semiconductor layer 106 (step 410), as depicted in FIG. 3E, where each of the plurality of Zener implant regions 120a, 120b, and 120c is buried in the semiconductor layer 106 and in the third region 128. The method 400 may next comprise growing the first region 124a and the second region 124b, both by implanting p-type doping in the semiconductor layer 106 (step 412), as depicted in FIG. 3E. The method 400 may next comprise growing the first isolation layer 122a between the first region 124a and the third region 128 (step 414), as depicted in FIG. 3F. The method 400 may include simultaneously growing the second isolation layer 122b between the second region 124b and the third region 128 (step 414), as depicted in FIG. 3F. The method 400 may then comprise the passivation and the metallization as a part of the back-end process for the fabrication (step 416), such as the structure 300 depicted in FIG. 3G. The method 400 may be adjusted as desired, including by adding, deleting, modifying, or rearranging one or more steps.

While preferred embodiments have been shown and described, modifications thereof can be made by one skilled in the art without departing from the scopes or teachings herein. The embodiments described herein are illustrative and are not limiting. For example, a buried Zener diode can be fabricated in an equivalent manner by reversing the dopant type of the various implants and well regions described above.

What is claimed is:

1. A method of fabricating an integrated circuit, comprising:
    forming an epitaxial layer and a semiconductor layer using a first-type dopant;
    forming a plurality of shallow-trench isolation regions and multiple sinker paths diffused along sidewalls of at least one of the plurality of shallow-trench isolation regions;
    forming a plurality of implant regions of a Zener diode in the semiconductor layer;
    forming a first region doped with a second-type dopant in the semiconductor layer such that each of the plurality of the implant regions of the Zener diode is buried in the semiconductor layer and in the first region;
    forming each of a second region and a third region in the semiconductor layer, each of the second and third regions doped with the first-type dopant; and
    forming a first isolation layer between the first region and the second region and a second isolation layer between the first region and the third region.

2. The method of claim 1, wherein the first-type dopant is a group-III element and the second-type dopant is a group-V element.

3. The method of claim 1, wherein the first-type dopant is a group-V element and the second-type dopant is a group-III element.

4. The method of claim 1, further comprising passivation and metallization of the integrated circuit.

5. The method of claim 1, wherein the semiconductor layer is moderately doped.

6. The method of claim 1, wherein the multiple sinker paths are moderately doped using the second-type dopant.

7. The method of claim 1, wherein the second region and the third region are heavily-doped.

8. The method of claim 1, wherein the first region is heavily-doped.

9. The method of claim 1, wherein the plurality of implant regions of a Zener diode is highly doped.

10. The method of claim 1, further comprising forming an isolation tub that comprises a substrate and a buried layer, wherein forming the epitaxial layer comprises growing the epitaxial layer from the buried layer.

11. The method of claim 10, wherein the buried layer is moderately doped using the second-type dopant.

12. The method of claim 1, wherein a first doped well of at least one of the implant regions of the Zener diode is formed in the first region and a second doped well of at least one of the implant regions of the Zener diode is formed in the semiconductor layer.

13. The method of claim 12, wherein the n-side of the plurality of implant regions of the Zener diode is formed by the first region and the first doped well, plus the p-side of the plurality of implant regions of the Zener diode is formed by the semiconductor layer and the second doped well.

14. The method of claim 12, wherein the second doped well is highly-doped.

15. The method of claim 14, wherein the second doped well is doped using boron 11 (B11).

16. The method of claim 12, wherein the first doped well is highly-doped.

17. The method of claim 16, wherein the first doped well is doped using arsenic (As).

18. The method of claim 1, wherein the first region and the semiconductor layer are configured to form an avalanche region positioned between a pair of the plurality of implant regions of the Zener diode.

19. The method of claim 18, wherein the first region forms the n-side of the avalanche diode and the semiconductor layer forms the p-side of the avalanche diode.

20. The method of claim 18, wherein the avalanche region is lightly doped.

* * * * *